United States Patent
Kubota et al.

(10) Patent No.: US 7,321,198 B2
(45) Date of Patent: Jan. 22, 2008

(54) ION SOURCE WITH UNIFORMITY OF RADIAL DISTRIBUTION OF ION BEAM INTENSITY

(75) Inventors: Naoki Kubota, Tokyo (JP); Akihiro Horita, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/445,260

(22) Filed: Jun. 2, 2006

(65) Prior Publication Data

US 2007/0029501 A1 Feb. 8, 2007

(30) Foreign Application Priority Data

Jun. 9, 2005 (JP) ............................. P2005-170007

(51) Int. Cl.
*H01J 7/24* (2006.01)
*H01J 27/00* (2006.01)

(52) U.S. Cl. ............................. 315/111.31; 315/111.81; 250/423 R (58) Field of Classification Search ........... 315/111.31, 315/111.81, 111.91; 250/423 R, 426, 427
See application file for complete search history.

(56) References Cited

U.S. PATENT DOCUMENTS

| | | | | |
|---|---|---|---|---|
| 3,760,225 A | * | 9/1973 | Ehlers et al. | 376/109 |
| 4,423,355 A | * | 12/1983 | Kageyama | 315/111.81 |
| 4,857,809 A | * | 8/1989 | Torii et al. | 315/111.31 |
| 5,620,522 A | * | 4/1997 | Ichimura et al. | 118/723 MR |
| 7,196,337 B2 | * | 3/2007 | Mikolas | 250/423 R |

FOREIGN PATENT DOCUMENTS

| | | |
|---|---|---|
| JP | A-9-148264 | 6/1997 |
| JP | A-11-162867 | 6/1999 |
| JP | A-2003-323999 | 11/2003 |
| JP | A 2004-039459 | 2/2004 |

* cited by examiner

*Primary Examiner*—Thuy Vinh Tran
(74) *Attorney, Agent, or Firm*—Oliff & Berridge, PLC

(57) ABSTRACT

An ion source, comprising: a discharge chamber, in which is formed an opening; a coil, provided outside said discharge chamber, for generating plasma within said discharge chamber; an extraction electrode, which extracts ions in said plasma generated in said discharge chamber from said opening and generates an ion beam; a power supply device, which supplies power to said coil; and a control device, which can repeatedly halt output power output from said power supply device over prescribed intervals, while maintaining a value of said output power at a value, set in advance, which renders radial direction distribution of ion beam intensity of said ion beam uniform.

8 Claims, 11 Drawing Sheets

ION SOURCE WITH UNIFORMITY OF RADIAL DISTRIBUTION OF ION BEAM INTENSITY

BACKGROUND OF THE INVENTION

1. Field of the Invention

The present invention relates to an ion source.

2. Related Background Art

As disclosed in Japanese Patent Laid-open No. 2004-39459, an ion source is known in which ions are extracted from plasma generated within a discharge chamber to emit an ion beam. Such an ion source is for example used in an ion beam etching apparatus (also called an ion milling apparatus). When used in an ion beam etching apparatus, by irradiating the surface of a substrate with the ion beam emitted from the ion source, the substrate can be etched.

SUMMARY OF THE INVENTION

However, in some cases it may be necessary, even within a given ion beam etching apparatus, to vary the etching rate greatly, by a factor of for example six through ten times. For example, when the etching depth is deep, there may be a need to perform rapid etching in order to shorten the etching time and improve productivity. And, when the etching depth is shallow, there may be a need to perform slow etching in order to reduce variation in the etch depth. When the etching depth is shallow, if rapid etching is performed it becomes difficult to ensure reproducibility of the etch depth. Further, when etching a substrate comprising various materials, often various etching rates are demanded. Thus different etching rates are required according to circumstances.

In order to obtain a desired etching rate, the ion beam intensity must be adjusted to a prescribed value. The ion beam intensity is expressed using the ion beam flux and the ion beam energy. Ion beam flux corresponds to the ion beam current value per unit area. Ion beam energy corresponds to the voltage value applied to the extraction electrode of the ion source.

The ion beam flux and the ion beam energy can be adjusted independently within a prescribed range. If for example the ion beam flux is held constant, then the higher the ion beam energy, the higher is the ion beam intensity as well. And if for example the ion beam energy is held constant, the larger the ion beam flux, the higher is the ion beam intensity as well.

The ion beam flux depends primarily on the density of plasma generated within the discharge chamber of the ion source. The plasma density depends for example on the value of the power applied to a coil outside the discharge chamber of the ion source, the coil position, the type of gas or flow rate of gas supplied to the interior of the discharge chamber, and so on. Normally the coil position, gas type, and gas flow rate are fixed at constant conditions, so that in order to adjust the ion beam flux, the value of the power applied to the coil is adjusted.

However, because there exist upper and lower limits to the power value which can be applied to the coil, the power value applied to the coil cannot be varied over a wide range. The upper limit to the power value applied to the coil depends primarily on the design dimensions of the extraction electrode. Since the design dimensions of the extraction electrode are optimized for the plasma density, ion beam current density and so on, when the plasma density, ion beam current density and so on exceed the assumed range, there are cases in which the ion beam etching apparatus will not work properly. For example, when the extraction electrode comprises three multi-hole grids (screen grid, acceleration grid, deceleration grid), the upper limit to the power value applied to the coil is determined by the dimensions of the holes. This is because when the value of the power applied to the coil is increased in order to increase the ion beam flux, plasma leaks from holes in the screen grid, and anomalous discharge (arcing) occurs between the screen grid and the acceleration grid.

On the other hand, the lower limit to the value of power applied to the coil depends on whether the plasma can be maintained. In order to maintain the plasma, the value of the power applied to the coil must be set to a prescribed value or higher. This prescribed value is usually set to a value somewhat higher than the lowest value necessary to maintain the plasma. This is done for the following reason. When the above-described anomalous discharge occurs at the extraction electrode, plasma is concentrated in the vicinity of the extraction electrode, so that plasma cannot be maintained throughout in the entire discharge chamber. Hence the value of power applied to the coil is set to a somewhat high value, in order that plasma is maintained even if some degree of anomalous discharge occur.

There also exists an upper limit to the ion beam energy. The withstand voltage of the extraction electrode is determined by, for example, the distance between the screen grid and the acceleration grid, and the distance between the acceleration grid and the deceleration grid. Consequently when a voltage outside the assumed range is applied between the screen grid and the acceleration grid, or between the acceleration grid and the deceleration grid, anomalous discharge occurs.

In this way, numerous constraints are imposed on adjustment of the ion beam flux and the ion beam energy.

Further, when the power value applied to the coil in order to obtain the desired ion beam intensity is changed, the spatial distribution of the plasma density changes, so that the uniformity of the radial direction distribution of the ion beam flux in the ion beam emitted from the ion source is reduced. As a result, the uniformity of the radial direction distribution of the ion beam intensity is also reduced. In an ion beam etching apparatus in particular, since normally the beam diameter is from 30 through 40 cm, reduced uniformity of the radial direction distribution of the ion beam intensity leads to a marked drop in the in-plane uniformity of the etching rate. Further, since strict demands have been imposed on machining precision in recent years, even greater in-plane uniformity of the etching rate is required.

Figure 11:
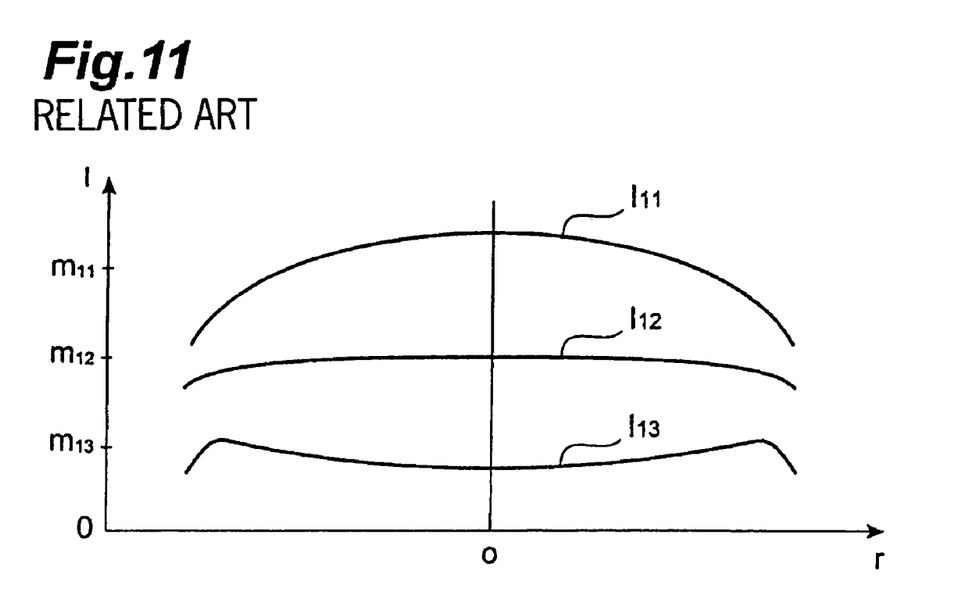

FIG. 11 is a graph which schematically shows the uniformity of the radial direction distribution of ion beam intensity. The vertical axis I of the graph indicates the ion beam intensity. The horizontal axis r indicates the position in the radial direction of the ion beam. The solid line $I_{12}$ represents the radial direction distribution of the ion beam intensity when the radial direction distribution of the ion beam intensity has been made uniform by optimizing the power value applied to the coil. At this time, the average value of the radial direction distribution of the ion beam intensity is $m_{12}$. The solid line $I_{11}$ represents the radial direction distribution of the ion beam intensity when the power value applied to the coil is increased, in order to increase the average value of the radial direction distribution of the ion beam intensity. At this time, the average value of the radial direction distribution of the ion beam intensity is $m_{11}$. The solid line $I_{13}$ represents the radial direction distribution of the ion beam intensity when the power value applied to the coil is reduced, in order to reduce the average value of the radial direction distribution of the ion beam intensity. At this time, the average value of the radial direction distribution of the ion beam intensity is $m_{13}$.

As is clear from FIG. 11, when the power value applied to the coil is changed in order to adjust the average value of the radial direction distribution of the ion beam intensity, the uniformity of the radial direction distribution of the ion beam intensity declines.

This invention was devised in light of the above circumstances, and has as an object the provision of an ion source enabling adjustment of the average value of the radial direction distribution of the ion beam intensity, while maintaining uniformity of the radial direction distribution of the ion beam intensity.

In order to resolve the above problems, an ion source, comprising a discharge chamber, in which is formed an opening; a coil, provided outside the discharge chamber, for generating plasma within the discharge chamber; an extraction electrode, which extracts ions in the plasma generated in the discharge chamber from the opening and generates an ion beam; a power supply device, which supplies power to the coil; and a control device, which can repeatedly halt output power output from the power supply device over prescribed intervals, while maintaining a value of the output power at a value, set in advance, which renders radial direction distribution of ion beam intensity of the ion beam uniform.

It is preferable that the control device be capable of adjusting a frequency of a halted interval of the output power.

It is preferable that the control device be capable of adjusting a ratio of an output interval of the output power to a halted interval of the output power.

It is preferable that the control device shortens a halted interval of the output power with time, in an initial interval from a start of output of the output power.

It is preferable that the control device lengthens a halted interval of the output power with time, in a final interval until an end of output of the output power.

DESCRIPTION OF THE PREFERRED EMBODIMENTS

Below, embodiments of the present invention are explained in detail, referring to the attached drawings. In explanations of the drawings, elements which are the same or equivalent are assigned the same symbols, and redundant explanations are omitted.

Figure 1:
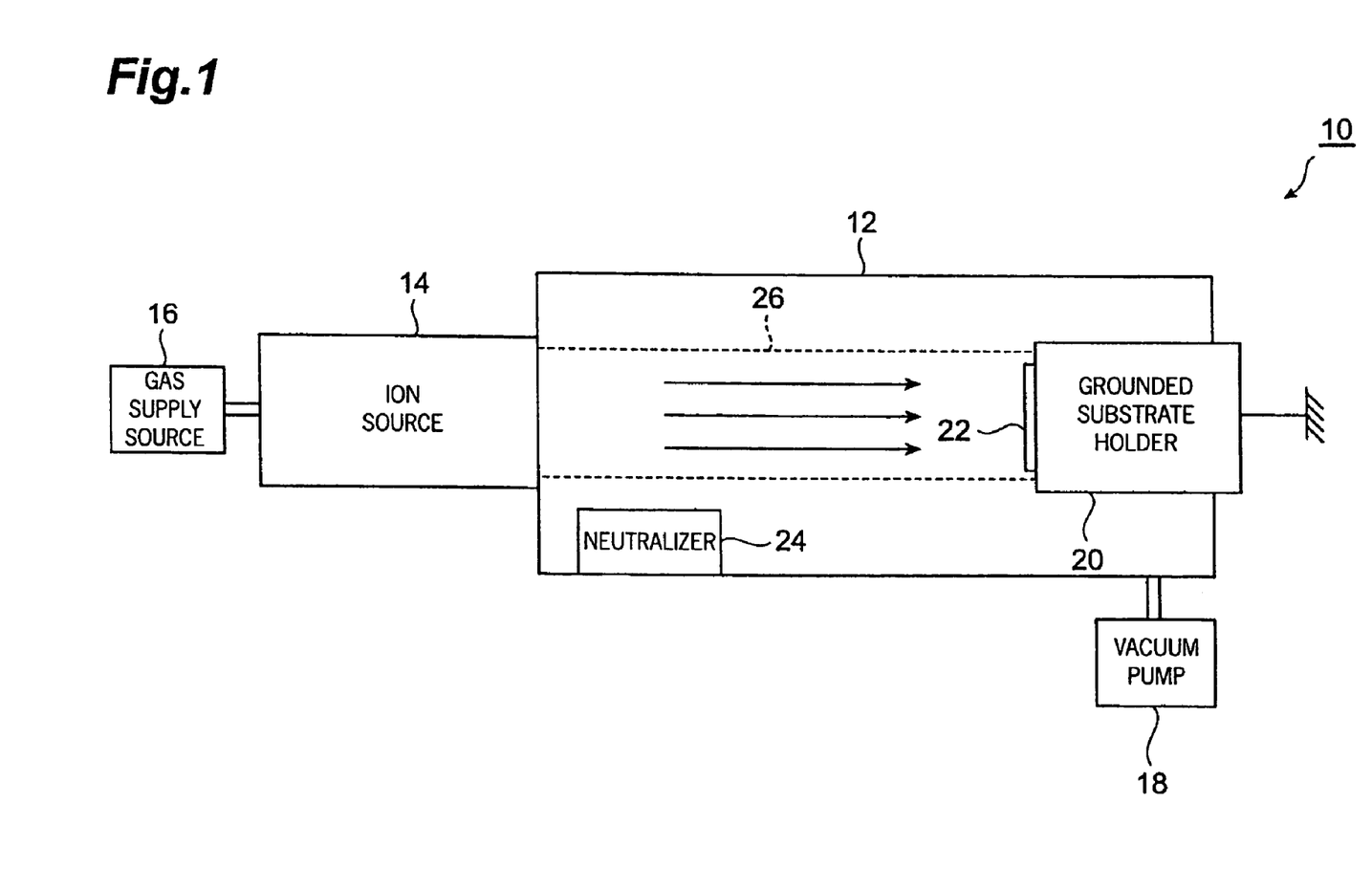
FIG. 1 schematically shows an ion beam etching apparatus comprising the ion source of an embodiment of the invention.

FIG. 1 schematically shows an ion beam etching apparatus comprising the ion source of an embodiment of the invention. The ion beam etching apparatus 10 shown in FIG. 1 comprises an ion source 14 which generates an ion beam 26, and a chamber 12 which accommodates a substrate 22 to be irradiated by the ion beam 26. The ion beam 26 propagates within the chamber 12. The substrate 22 is etched by the ion beam 26. The substrate 22 is supported by a grounded substrate holder 20. The substrate 22 is for example a silicon wafer. The ion beam 26 comprises, for example, $Ar^+$ or other positive ions. The ion beam 26 is not limited to positive ions.

A gas supply source 16 which supplies gas to generate the plasma is connected to the ion source 14. A neutralizer 24 to neutralize the ion beam 26 is positioned within the chamber 12. When for example the ion beam 26 comprises $Ar^+$ or other positive ions, electrons are emitted from the neutralizer 24. In addition, the chamber 12 is connected to a vacuum pump 18 to maintain the interior of the chamber 12 at a prescribed pressure.

Figure 2:
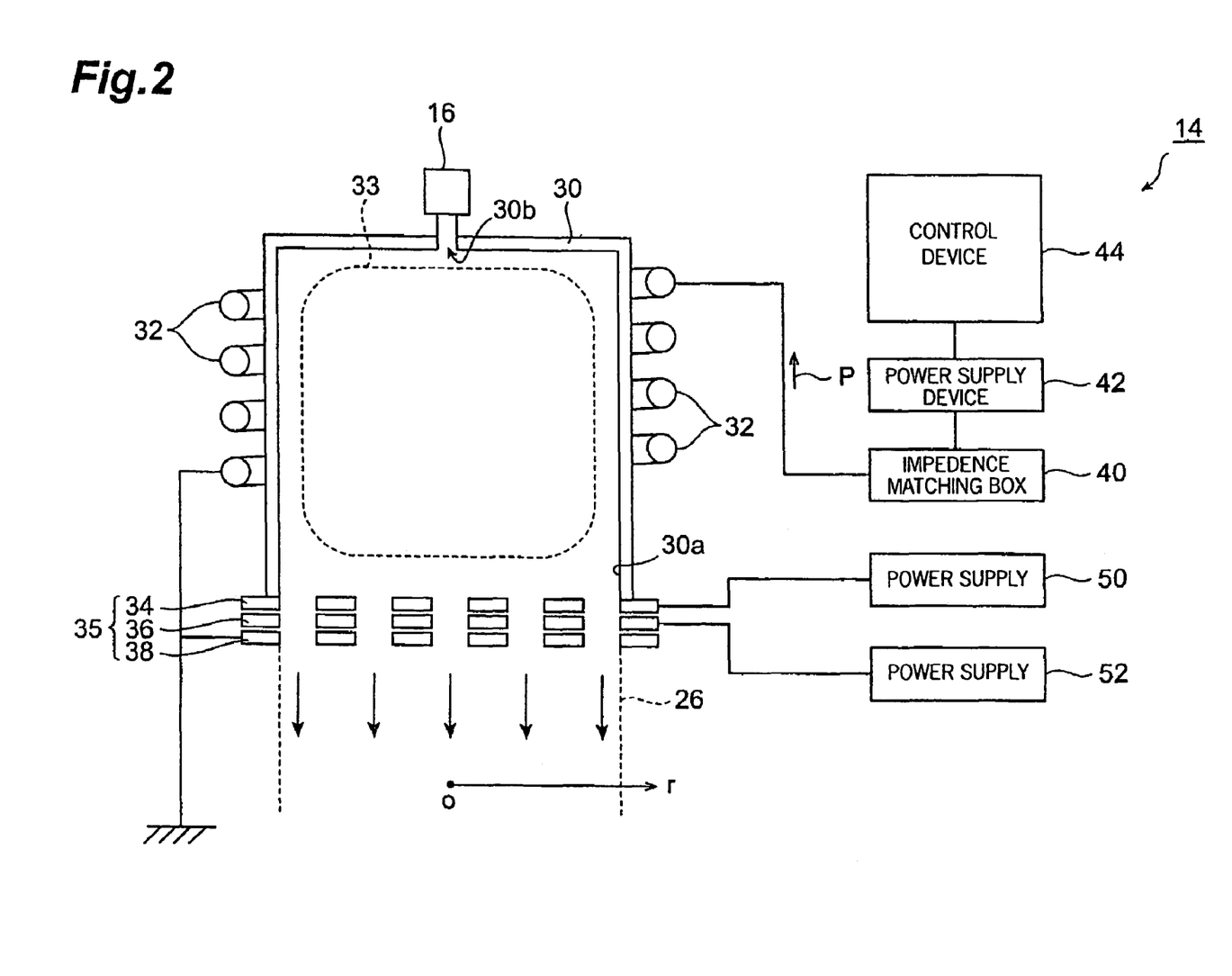
FIG. 2 schematically shows the ion source of an embodiment.

FIG. 2 schematically shows the ion source of an embodiment. The ion source 14 shown in FIG. 2 comprises a discharge chamber 30 in which is formed an opening 30a, and a coil 32, provided outside the discharge chamber 30, to generate plasma 33 within the discharge chamber 30. It is preferable that the discharge chamber 30 have as the major component a dielectric material, such as for example quartz or an aluminum oxide material. The ion source 14 comprises an extraction electrode 35, to extract the plasma 33 generated within the discharge chamber 30 from the opening 30a and generate an ion beam 26, a power supply device 42 to supply power to the coil 32, and a control device 44 connected to the power supply device 42. An opening 30b, to introduce gas into the discharge chamber 30, is for example formed in the discharge chamber 30. Ar gas or other gas is supplied, via the opening 30b, from the gas supply source 16 into the discharge chamber 30.

The control device 44 can repeatedly halt the output power P over prescribed intervals, while maintaining the value of the output power P output from the power supply device 42 at a value $P_0$ (hereafter called the "uniform output power value $P_0$") such that the radial direction distribution of the ion beam intensity I of the ion beam 26 is uniform. The uniform output power value $P_0$ is set in advance by adjusting the position of the coil 32, the type or flow rate of gas supplied into the discharge chamber 30, and so on. It is preferable that the uniform output power value $P_0$ be substantially a constant value.

It is preferable that the extraction electrode 35 have a screen grid 34, an acceleration grid 36, and a deceleration grid 38. The extraction electrode 35 need not have a deceleration grid 38. The screen grid 34, acceleration grid 36, and deceleration grid 38 are placed in order facing from the inside of the discharge chamber 30 to the outside. The screen grid 34, acceleration grid 36 and deceleration grid 38 are each, for example, metal plates in which a plurality of holes are formed.

The screen grid 34 can separate the plasma 33 from the acceleration grid 36. The screen grid 34 is for example connected to a power supply 50 to continuously apply a positive high voltage. The voltage applied to the screen grid 34 is for example from 400 to 1500 V. The voltage applied to the screen grid 34 determines the ion beam energy of the ion beam 26.

The acceleration grid 36 is also called a suppression electrode. The acceleration grid 36 is for example connected to a power supply 52 to continuously apply a negative high voltage. The voltage applied to the acceleration grid 36 is for example from −200 to −1000 V. The deceleration grid 38 is also called a ground electrode, and is grounded. By adjusting the potential difference between the acceleration grid 36 and the deceleration grid 38, the lens effect can be used to control the ion beam diameter of the ion beam 26 within a prescribed numerical range.

One end of the coil 32 is connected to the power supply device 42 via for example an impedance matching box 40. The other end of the coil 32 is for example connected to ground. The power supply device 42 is for example a high-frequency power supply or a high-frequency amplifier. In this case, it is preferable that the frequency of the power supply device 42 be from several MHz to several tens of MHz (for example, from 2 to 13.5 MHz). As one example, the frequency of the power supply device 42 is for example 4 MHz. It is preferable that the power supply device 42 apply power to the coil 32 in the range of, for example, 200 to 2000 W, according to the shape and volume of the discharge chamber 30.

The ion beam 26 is for example emitted from the ion source 14 in the following manner. First, the pressure in the interior of the discharge chamber 30 is lowered to for example approximately $10^{-5}$ Pa, and Ar gas or another gas is introduced into the discharge chamber 30 from the gas supply source 16. Next, by supplying power to the coil 32 from the power supply device 42, plasma 33 is generated within the discharge chamber 30. The $Ar^+$ or other ions in this plasma 33 are extracted as an ion beam 26 by the extraction electrode 35.

Figure 3:
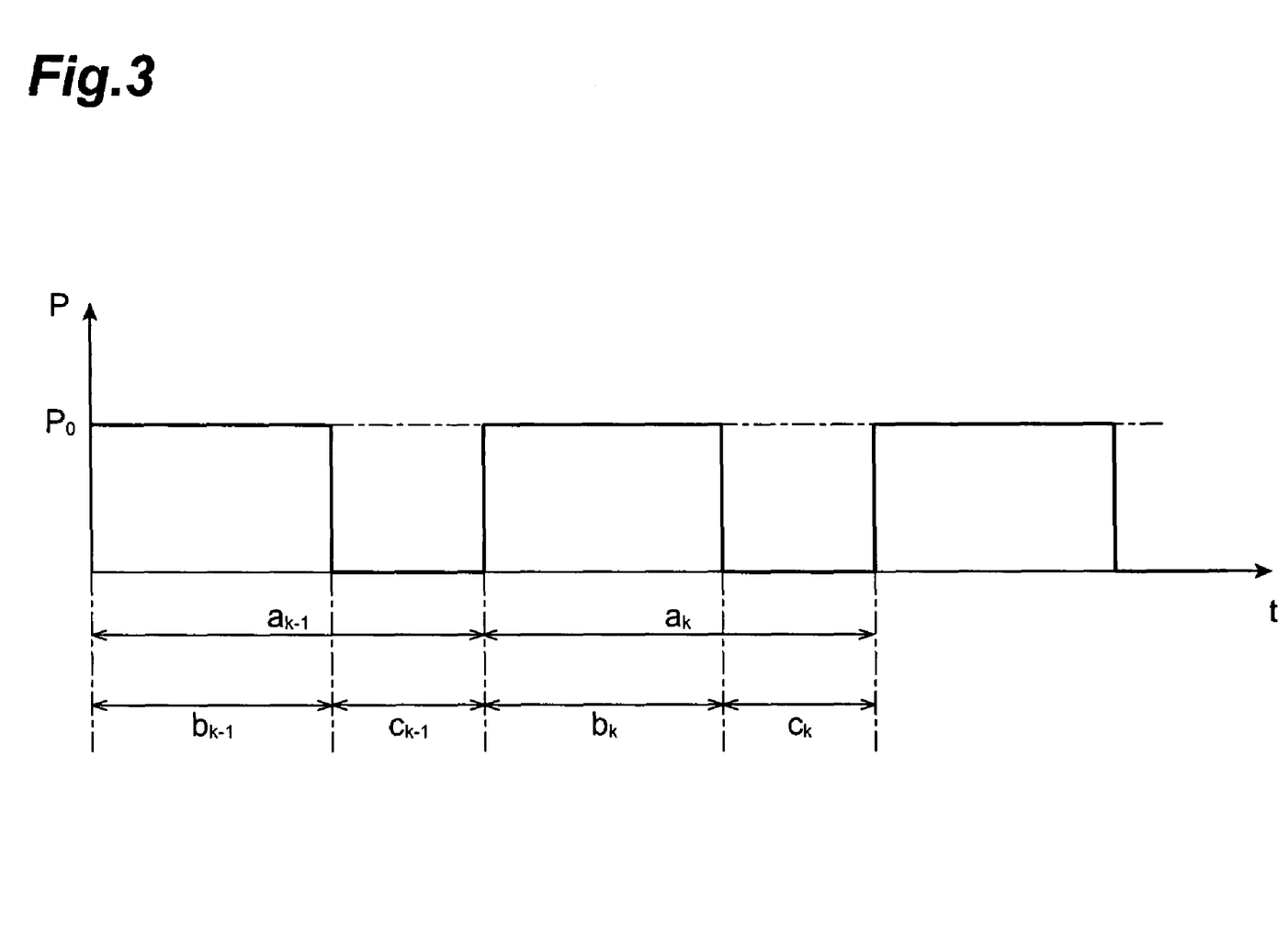
FIG. 3 is a graph which schematically shows the change with time in the output power output from the power supply device of the ion source of an embodiment.

FIG. 3 is a graph which schematically shows the change with time in the output power output from the power supply device of the ion source of the embodiment. The vertical axis P in the graph indicates the output power P output from the power supply device 42 (see FIG. 2). The horizontal axis t of the graph indicates time. In this embodiment, the output power P describes a pulse waveform.

The control device 44 repeatedly halts the power output over prescribed intervals, while maintaining a uniform output power value $P_0$. Hence in a halted interval $c_k$ in which the output power P is halted (an off interval), power is not supplied to the coil 32; and in an output interval $b_k$ in which output power P is output (an on interval), power at a uniform output power value $P_0$ is supplied to the coil 32. The output interval $b_k$ and the halted interval $c_k$ make up a pitch $a_k$. k is a counting number. The value $b_k/a_k$ is called a duty ratio. The values of the output interval $b_k$ and the halted interval $c_k$ can each be set arbitrarily. Hence the value of the pitch $a_k$ can also be changed.

Figure 4:
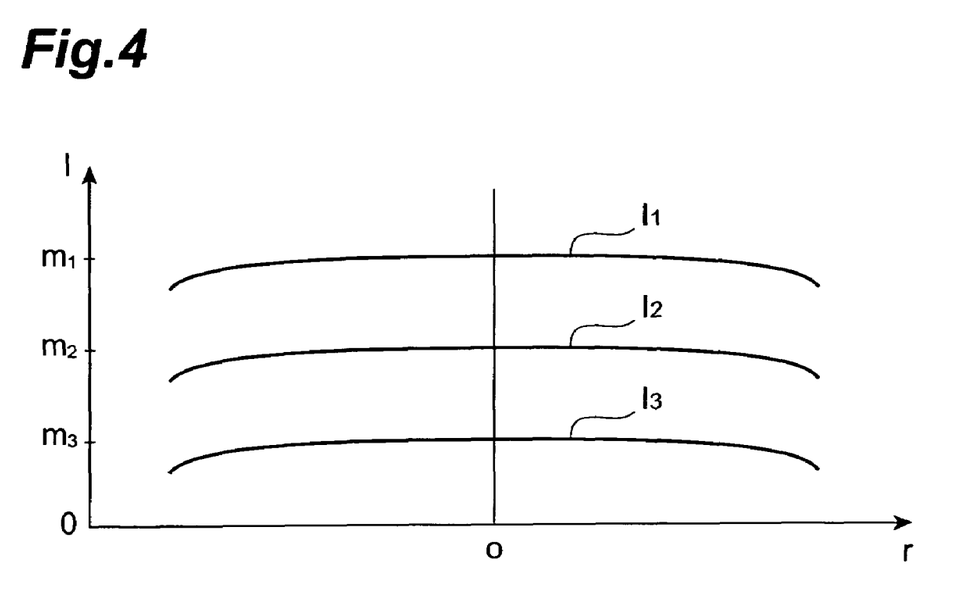
FIG. 4 is a graph which schematically shows the uniformity of the radial direction distribution of ion beam intensity.

FIG. 4 is a graph which schematically shows the uniformity of the radial direction distribution of ion beam intensity. The vertical axis I of the graph indicates the ion beam intensity I, and the horizontal axis r indicates the position in the radial direction of the ion beam 26 (see FIG. 2). The solid line $I_1$ shows the radial direction distribution of the ion beam intensity I when the value of the output power P is set in advance to the uniform output power value $P_0$, and output power P at the uniform output power value $P_0$ is applied continuously to the coil 32. At this time, the ion beam intensity average value m is $m_1$.

Here, as shown in FIG. 3, since the ion beam flux can be reduced by a desired amount by repeatedly halting over prescribed intervals the output power P, the ion beam intensity average value m can be reduced. For example, the solid line $I_2$ shown in FIG. 4 represents the radial direction distribution of the ion beam intensity I when the value of the output power P is repeatedly halted over prescribed intervals, while maintaining the uniform output power value $P_0$. At this time, the ion beam intensity average value m is value $m_2$, smaller than $m_1$. Further, if the halted interval $c_k$ is lengthened, the ion beam intensity I takes on the radial direction distribution represented by the solid line $I_3$ in FIG. 4. At this time, the ion beam intensity average value m is $m_3$, smaller than $m_2$.

In the ion source 14, when the ion beam intensity average value m is to be reduced, it is sufficient to maintain the value of the output power P at the uniform output power value $P_0$, and there is no need to change the value. Further, when the ion beam intensity average value m is to be raised, when determining the uniform output power value $P_0$, the uniform output power value $P_0$ can be set higher by adjusting in advance the position of the coil 32, the type or flow rate of the gas supplied into the discharge chamber 30, and so on. By lengthening the halted interval $c_k$, the ion beam intensity average value m can be adjusted.

Hence it is possible to adjust the ion beam intensity average value m of the ion source 14 of this embodiment while maintaining uniformity of the radial direction distribution of the ion beam intensity. Specifically, for example, the ion beam intensity average value m can be adjusted without changing the value of the output power P or the value of the voltage applied to the screen grid 34.

It is preferable that the control device 44 be able to adjust the frequency of the halted interval $c_k$ of the output power P. By adjusting the frequency of the halted interval $c_k$, a desired ion beam intensity average value m can easily be obtained. For example, by increasing the frequency of the halted interval $c_k$, the ion beam intensity average value m can be lowered.

Further, it is preferable that the control device 44 be able to adjust the ratio of the output interval $b_k$ to the halted interval $c_k$ of the output power P. By adjusting the ratio of the output interval $b_k$ to the halted interval $c_k$, a desired ion beam intensity average value m can easily be obtained. For example, by lengthening the halted interval $c_k$ while fixing the output interval $b_k$, the ion beam intensity average value m can be lowered.

Further, by using an ion beam etching apparatus 10 comprising the above-described ion source 14, the in-plane uniformity of the etching rate can be improved. For example, these inventors performed experiments for a case in which the etching rate was set to a high 100 nm/minute, in an ion beam etching apparatus which uses an argon ion beam to perform etching of a silicon wafer of diameter 100 mm at an etching rate of 80 nm/minute. As a result, when the etching rate was increased by increasing the value of the output power P as in the prior art, the in-plane variation in the etching rate was approximately ±5%. In contrast, when the ion source 14 of this embodiment was used, repeatedly halting the output power P over a prescribed interval while maintaining a uniform output power value $P_0$, the in-plane variation in the etching rate could be reduced to approximately ±2%.

Below, embodiments are explained, referring to FIG. 5A through FIG. 10C, in which the output interval $b_k$ and the halted interval $c_k$ are variously changed.

Figure 5A:
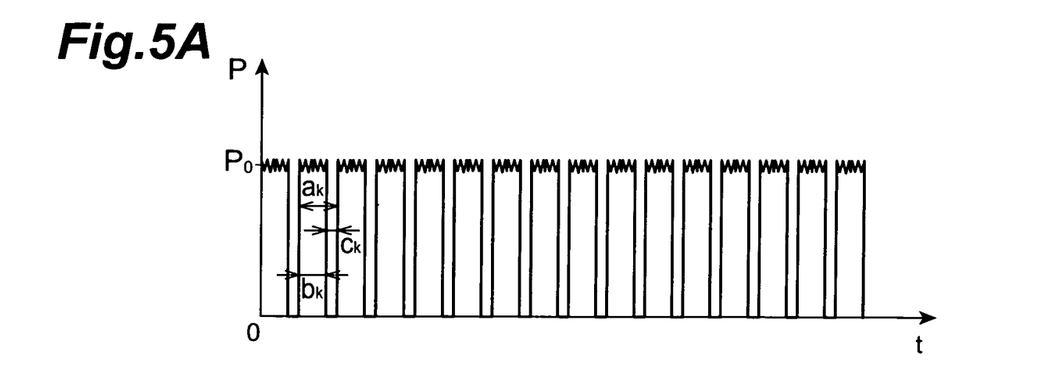
FIG. 5A is a graph which schematically shows changes with time in the output power output from the power supply device of the ion source in another embodiment.
Figure 5B:
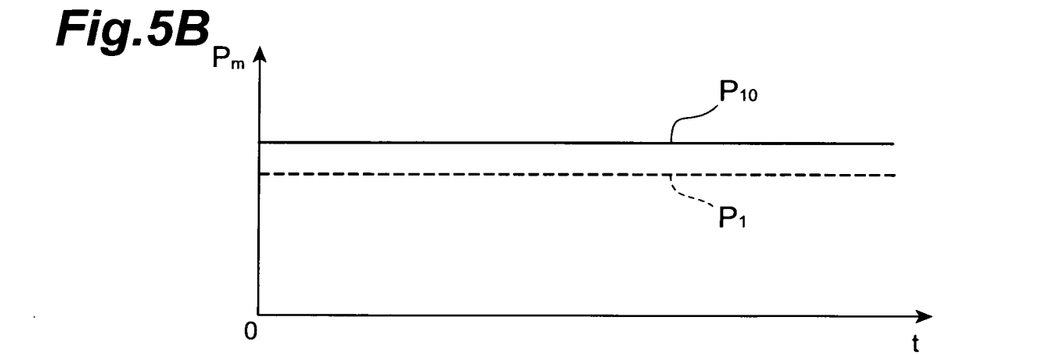
FIG. 5B is a graph which schematically shows the time average of the output power shown in FIG. 5A.
Figure 5C:
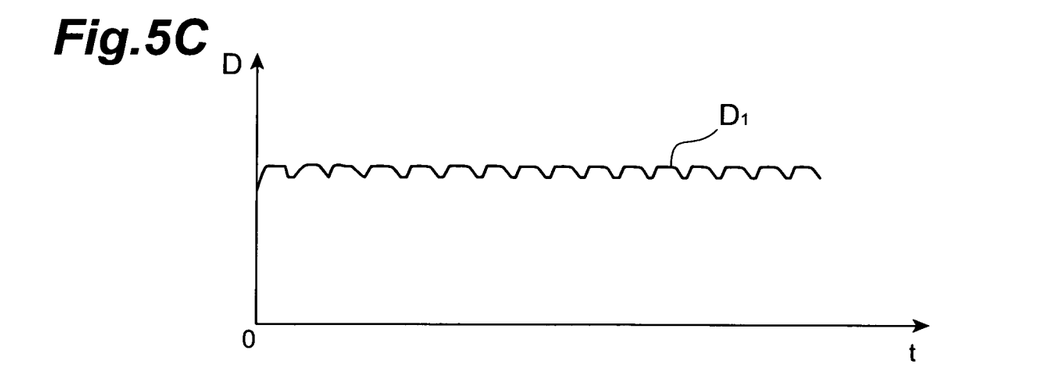
FIG. 5C is a graph which schematically shows changes with time in the plasma density when the output power shown in FIG. 5A is applied.

FIG. 5A is a graph which schematically shows changes with time in the output power output from the power supply device of the ion source in another embodiment. FIG. 5B is a graph which schematically shows the time average of the output power shown in FIG. 5A. FIG. 5C is a graph which schematically shows changes with time in the plasma density when the output power shown in FIG. 5A is applied.

In FIG. 5A, FIG. 5B and FIG. 5C, the horizontal axis t of the graphs represents time. The vertical axis P of the graph in FIG. 5A indicates output power P. The vertical axis $P_m$ of the graph in FIG. 5B indicates the average output power when partitioned into 10 millisecond intervals. The vertical axis D of the graph in FIG. 5C indicates the plasma density of the plasma 33.

As shown in FIG. 5A, the value of the output power P is set in advance to the uniform output power value $P_0$. In this embodiment, the power supply device 42 is a high-frequency power supply. Hence the output power P describes a sine wave in the output interval $b_k$. Here, the uniform output power value $P_0$ is the average value of the output power P in the output interval $b_k$. The solid line $P_0$ shown in FIG. 5B represents the average output power when the uniform output power value $P_0$ is applied continuously. At this time, the halted interval $c_k$ is 0. On the other hand, the dashed line $P_1$ represents the average output power when the uniform output power $P_0$ is applied in pulse form, and is corresponding to the average output power of the output power P in FIG. 5A. The solid line $D_1$ shown in FIG. 5C is the change with time in the plasma density corresponding to the change with time in the output power P of FIG. 5A.

Figure 6A:
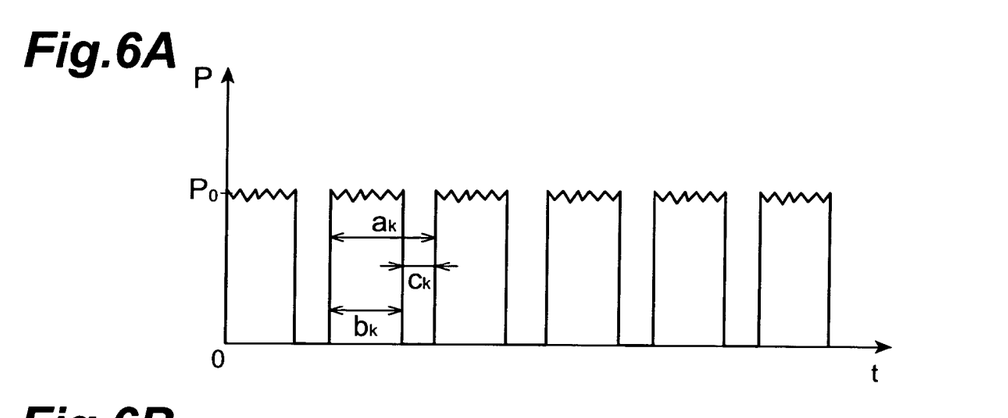
FIG. 6A is a graph which schematically shows changes with time in the output power output from the power supply device of the ion source in another embodiment.
Figure 6B:
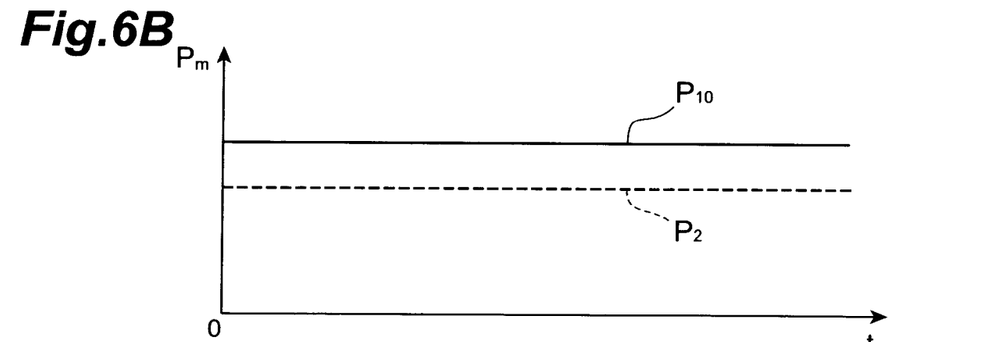
FIG. 6B is a graph which schematically shows the time average of the output power shown in FIG. 6A.
Figure 6C:
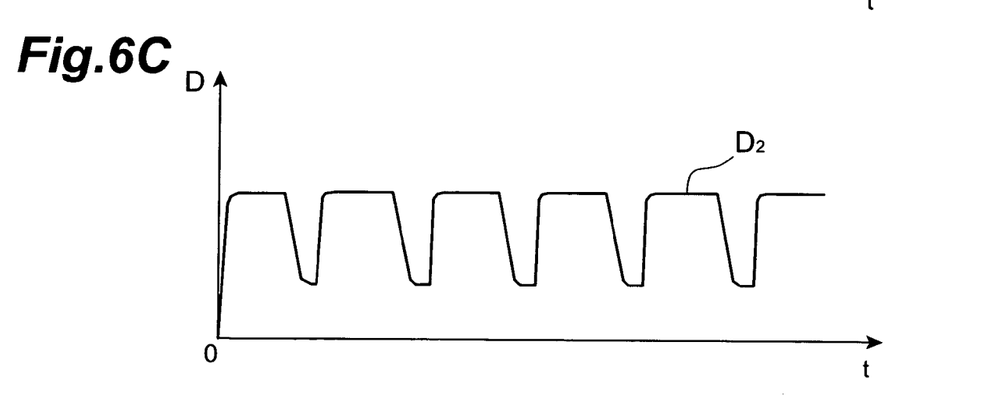
FIG. 6C is a graph which schematically shows changes with time in the plasma density when the output power shown in FIG. 6A is applied.

FIG. 6A through FIG. 6C correspond to FIG. 5A through FIG. 5C respectively. The halted interval $c_k$ shown in FIG. 6A is set to be shorter than the halted interval $c_k$ shown in FIG. 5A. The dashed line $P_2$ shown in FIG. 6B represents the average output power when the uniform output power value $P_0$ is applied in pulse form, and is corresponding to the average output power of the output power P in FIG. 6A. The solid line $D_2$ in FIG. 6C indicates the change with time in the plasma density corresponding to the change with time in the output power P of FIG. 6A. In this case, the plasma 33 is not completely extinguished in the halted interval $c_k$. Since the rate of extinction of plasma 33 depends for example on the type of gas in the discharge, the discharge pressure and so on, it is preferable that the output interval $b_k$ and the halted interval $c_k$ be adjusted according to the discharge conditions.

Figure 7A:
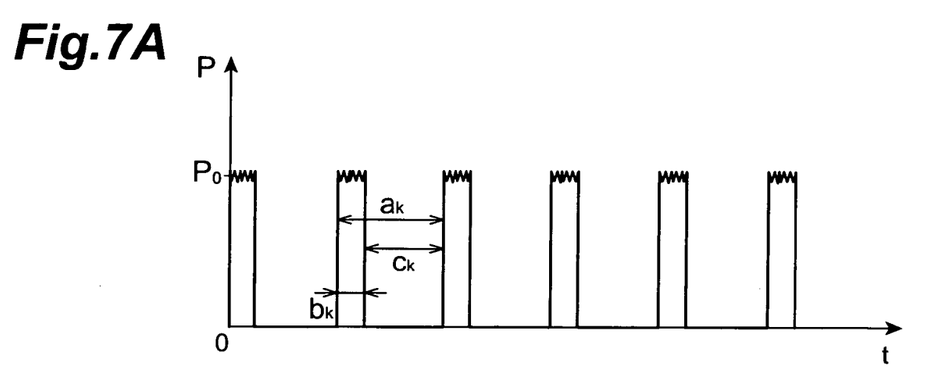
FIG. 7A is a graph which schematically shows changes with time in the output power output from the power supply device of the ion source in another embodiment.
Figure 7B:
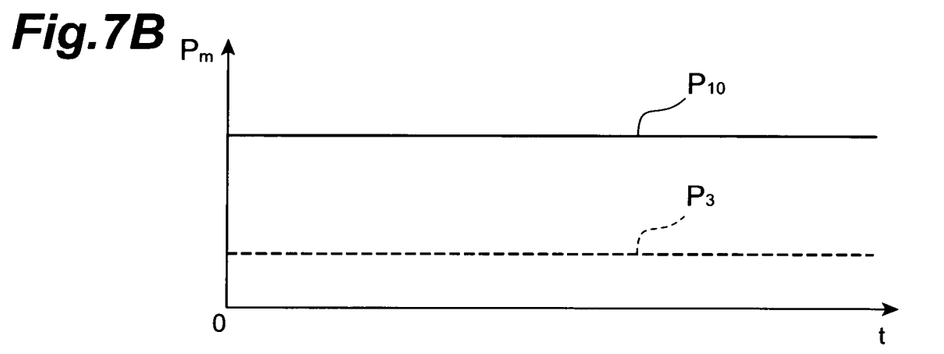
FIG. 7B is a graph which schematically shows the time average of the output power shown in FIG. 7A.
Figure 7C:
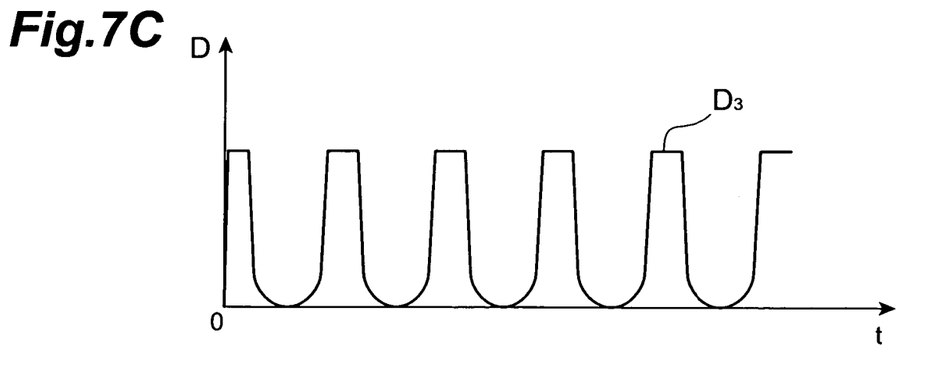
FIG. 7C is a graph which schematically shows changes with time in the plasma density when the output power shown in FIG. 7A is applied.

FIG. 7A through FIG. 7C correspond to FIG. 5A through FIG. 5C respectively. The halted interval $c_k$ shown in FIG. 7A is set longer than the halted interval $c_k$ in FIG. 5A. The dashed line $P_3$ in FIG. 7B indicates the average output power when the uniform output power value $P_0$ is applied in pulse form, and is corresponding to the average output power of the output power P in FIG. 7A. The solid line $D_3$ in FIG. 7C indicates the change with time in the plasma density corresponding to the time change in the output power P of FIG. 7A. In this case, the plasma 33 is completely extinguished during the halted interval $c_k$.

Figure 8A:
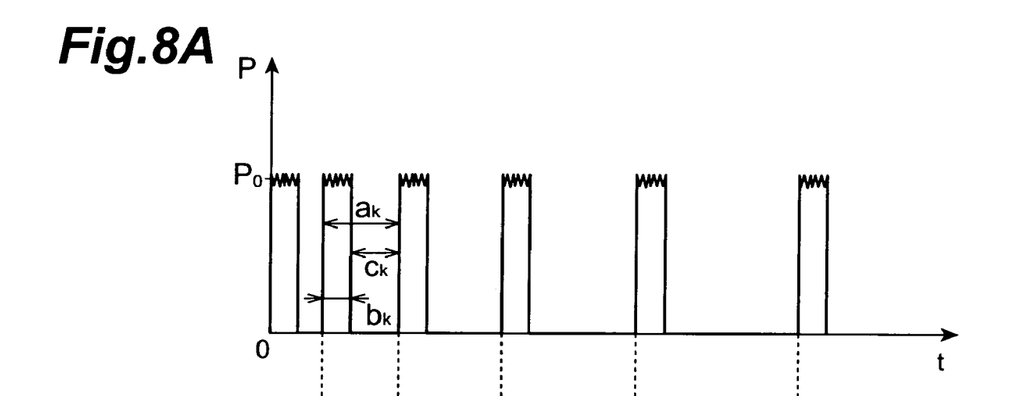
FIG. 8A is a graph which schematically shows changes with time in the output power output from the power supply device of the ion source in another embodiment.
Figure 8B:
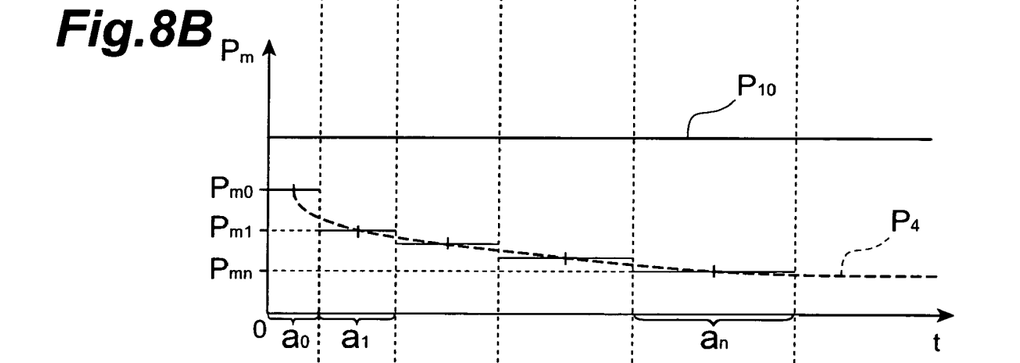
FIG. 8B is a graph which schematically shows the time average of the output power shown in FIG. 8A.
Figure 8C:
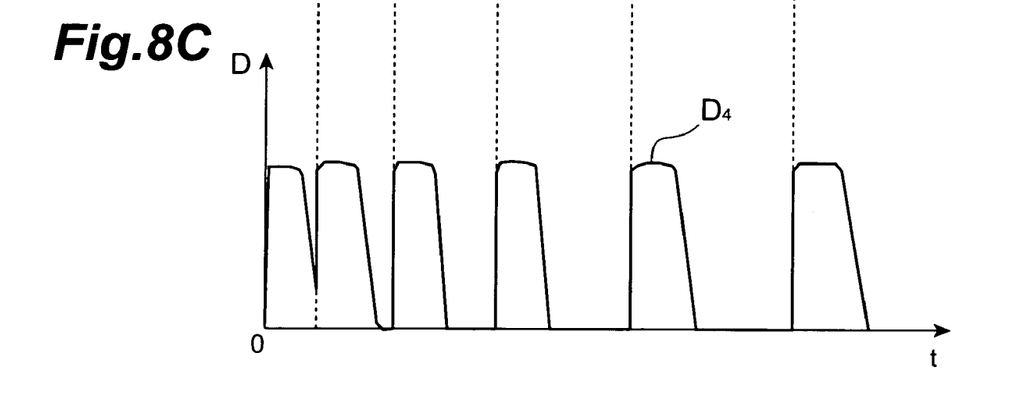
FIG. 8C is a graph which schematically shows changes with time in the plasma density when the output power shown in FIG. 8A is applied.

FIG. 8A through FIG. 8C correspond to FIG. 5A through FIG. 5C respectively. The halted interval $c_k$ shown in FIG. 8A is variable. It is preferable that the halted interval $c_k$ be made longer as time passes. The dashed line $P_4$ shown in FIG. 8B is the average output power when the uniform output power value $P_0$ is applied in pulse form, and is corresponding to the average output power of the output power P of FIG. 8A. The solid line $D_4$ in FIG. 8C indicates the change with time in the plasma density corresponding to the time change in the output power P of FIG. 8A.

The dashed line $P_4$ is a line connecting the average output power $P_{m0}, P_{m1}, \ldots, P_{mn}$ in each of the time segments $a_0, a_1, \ldots, a_n$, at the midpoints of the time segments $a_0, a_1, \ldots, a_n$, an. The average output power $P_{m0}, P_{m1}, \ldots, P_{mn}$ changes in steplike fashion on a microscopic scale, but on a macroscopic scale changes smoothly and continuously. Etching time normally extend from several minutes to several tens of minutes, whereas the time for pulse control is extremely short, ranging from tens of microseconds to tens of milliseconds. Hence the average plasma density can also be changed continuously with time.

Further, as shown in FIG. 8A and FIG. 8C, even when the length of the halted interval $c_k$ changes, the plasma density in the output interval $b_k$ is substantially constant. This indicates that the length of the halted interval $c_k$ has almost no effect on the plasma density or on the radial direction distribution of the ion beam intensity I.

Figure 9A:
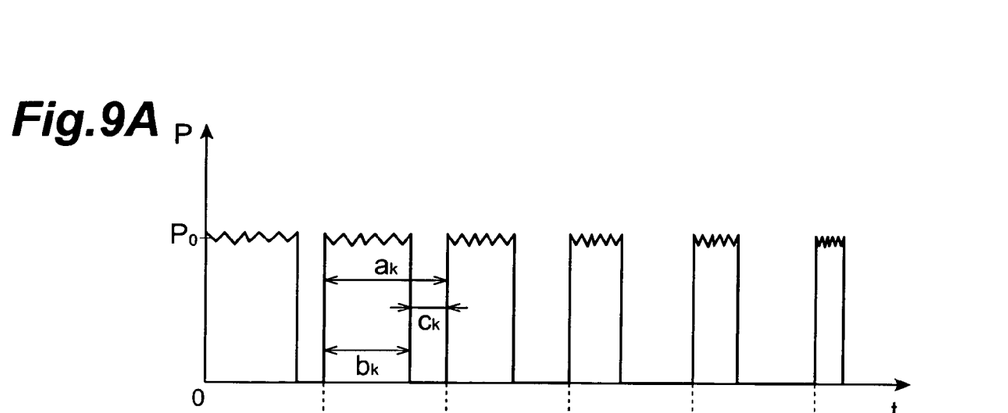
FIG. 9A is a graph which schematically shows changes with time in the output power output from the power supply device of the ion source in another embodiment.
Figure 9B:
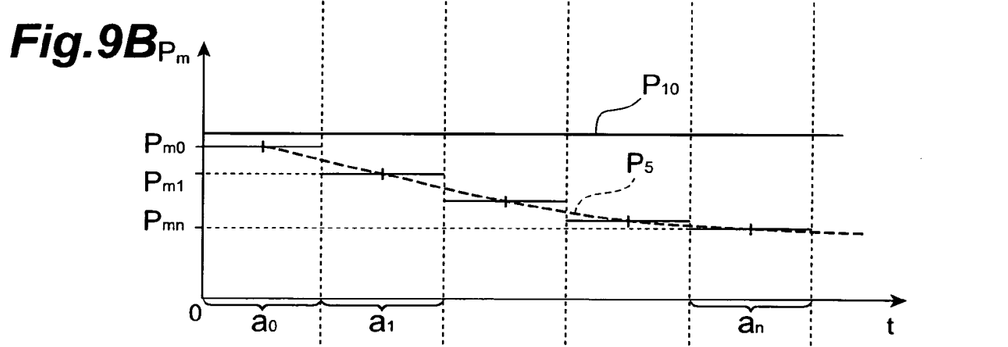
FIG. 9B is a graph which schematically shows the time average of the output power shown in FIG. 9A.
Figure 9C:
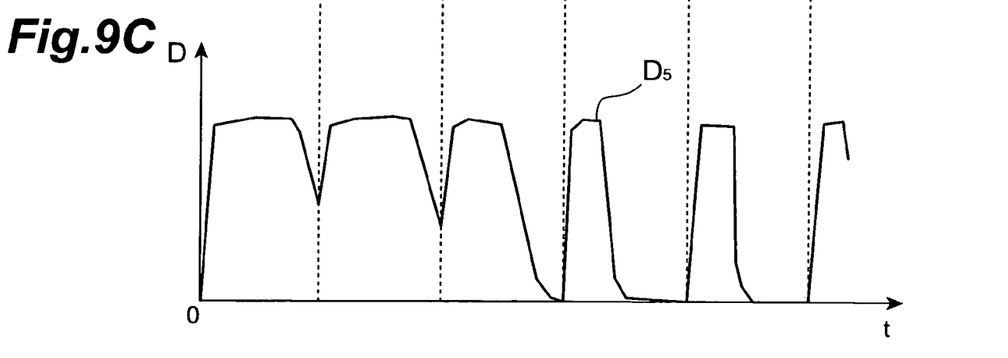
FIG. 9C is a graph which schematically shows changes with time in the plasma density when the output power shown in FIG. 9A is applied.

FIG. 9A to FIG. 9C correspond to FIG. 5A to FIG. 5C respectively. The pitch $a_k$ in FIG. 9A is constant. It is preferable that the halted interval $c_k$ be made longer as time passes. The dashed line $P_5$ in FIG. 9B indicates the average output power when the uniform output power $P_0$ is applied in pulse form, and is corresponding to the average output power of the output power P of FIG. 9A. The solid line $D_5$ shown in FIG. 9C shows the change with time in the plasma density corresponding to the time change in the output power P of FIG. 9A.

The dashed line $P_5$ is a line connecting the average output power $P_{m0}, P_{m1}, \ldots, P_{mn}$ in each of the time segments $a_0$, $a_1, \ldots, a_n$, at the midpoints of the time segments $a_0$, $a_1, \ldots, a_n$. The average output power $P_{m0}, P_{m1}, \ldots, P_{mn}$ changes in steplike fashion on a microscopic scale, but on a macroscopic scale changes smoothly and continuously. Etching time normally extend from several minutes to several tens of minutes, whereas the time for pulse control is extremely short, ranging from tens of microseconds to tens of milliseconds. Hence the average plasma density can also be changed continuously with time.

Figure 10A:
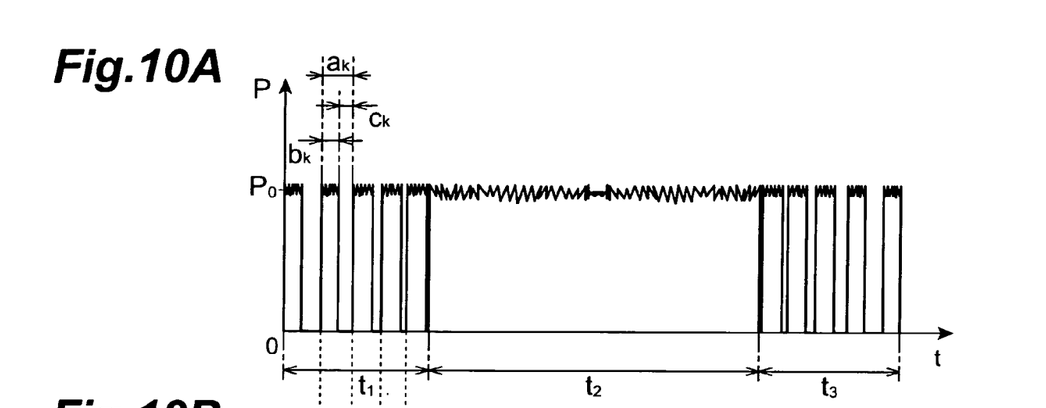
FIG. 10A is a graph which schematically shows changes with time in the output power output from the power supply device of the ion source in another embodiment.
Figure 10B:
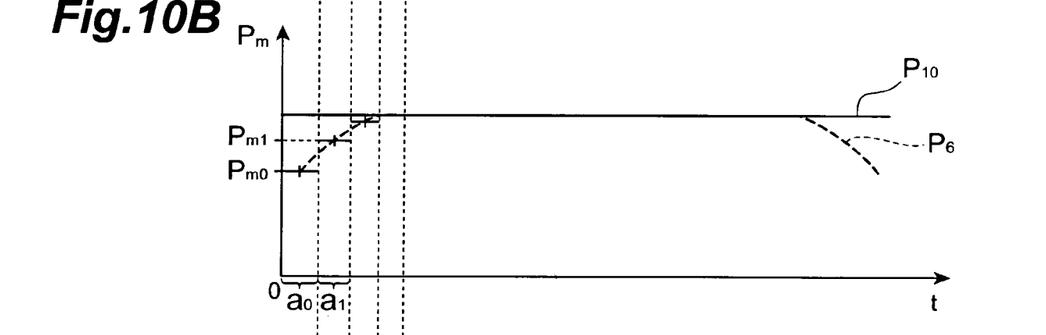
FIG. 10B is a graph which schematically shows the time average of the output power shown in FIG. 10A.
Figure 10C:
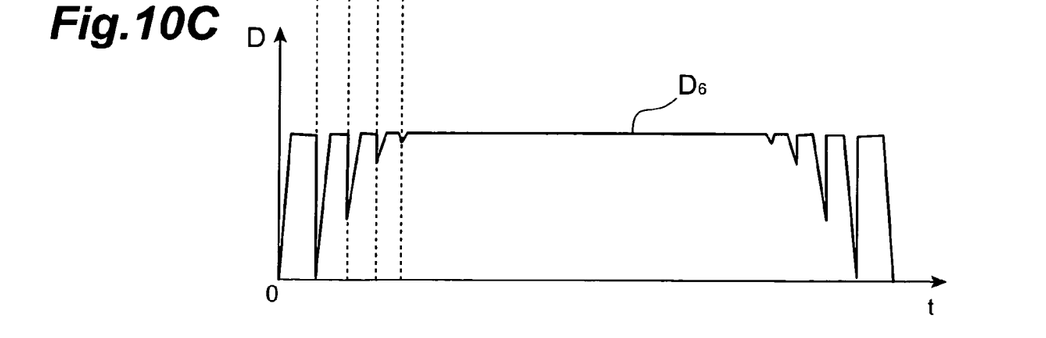
FIG. 10C is a graph which schematically shows changes with time in the plasma density when the output power shown in FIG. 10A is applied; and, FIG. 11 is a graph which schematically shows the uniformity of the radial direction distribution of ion beam intensity.

FIG. 10A to FIG. 10C correspond to FIG. 5A to FIG. 5C respectively. As shown in FIG. 10A, in the initial interval $t_1$, from the start of output of the output power P, it is preferable that the halted interval $c_k$ be set shorter as time passes. By this means, instability of the ion beam 26 in the initial interval $t_1$, can be reduced. Further, in the final interval $t_3$ until the end of output of output power P, it is preferable that the halted interval $c_k$ be set longer as time passes. By this means, fine adjustment of the ion beam flux in the final interval $t_3$ is possible. The dashed line $P_6$ shown in FIG. 10B shows the average output power when the uniform output power value $P_0$ is applied in pulse form in the initial interval $t_1$, and in the final interval $t_3$, and the uniform output power value $P_0$ is applied continuously in the emission interval $t_2$ positioned between the initial interval $t_1$, and the final interval $t_3$, and is corresponding to the average output power of the output power P in FIG. 10A. The solid line $D_6$ shown in FIG. 10C indicates the change with time in the plasma density corresponding to the time change in output power P in FIG. 10A.

In the initial interval $t_1$, and the final interval $t_3$, the dashed line $P_6$ is a line connecting the average output power $P_{m0}$, $P_{m1}, \ldots, P_{mn}$ in each of the time segments $a_0, a_1, \ldots, a_n$, at the midpoints of the time segments $a_0, a_1, \ldots, a_{mn}$. The average output power $P_{m0}, P_{m1}, \ldots, P_{mn}$ changes in steplike fashion on a microscopic scale, but on a macroscopic scale changes smoothly and continuously. Etching time normally extend from several minutes to several tens of minutes, whereas the time for pulse control is extremely short, ranging from tens of microseconds to tens of milliseconds. Hence the average plasma density can also be changed continuously with time.

When etching treatment is performed with for example the output power P shown in FIG. 10A used as the output power P output from the power supply device of the ion source, by shortening the halted interval $c_k$ as time passes in the initial interval $t_1$, the average output power can be increased continuously. Hence instability in the etching rate at the time etching starts can be alleviated. In particular, when the power supply device 42 is a high-frequency power supply, instability in the etching rate arising from the time required for high-frequency matching can be alleviated. Consequently, it is easier to ensure reproducibility of etching treatment.

Further, in the emission interval $t_2$, high-speed etching is achieved by continuously applying output power P at the uniform output power value $P_0$. Further, in the final interval $t_3$, by lengthening the halted interval $c_k$ as time passes, the average output power can be continuously lowered. Hence the etching rate in the final interval $t_3$ can be gradually lowered. By fine-adjusting the etching rate in this way, the desired etching depth can be obtained with high precision.

In the above, preferred embodiments of the invention have been explained in detail; but the invention is not limited to the above embodiments.

For example, the ion source 14 may be used in an ion beam emission device such as an ion beam sputtering device.

By means of this invention, an ion source is provided which is capable of adjusting the average value of the radial direction distribution of the ion beam intensity, while maintaining uniformity of the radial direction distribution of the ion beam intensity.

What is claimed is:

1. An ion source, comprising:
   a discharge chamber, in which is formed an opening;
   a coil, provided outside said discharge chamber, for generating plasma within said discharge chamber;
   an extraction electrode, which extracts ions in said plasma generated in said discharge chamber from said opening and generates an ion beam;
   a power supply device, which supplies power to said coil; and
   a control device, which repeatedly halts output power output from said power supply device over prescribed intervals, while maintaining a value of said output power at a value, set in advance, which renders radial direction distribution of ion beam intensity of said ion beam uniform.

2. The ion source according to claim 1,
   wherein said control device is configured to adjust a frequency of a halted interval of said output power.

3. The ion source according to claim 1,
   wherein said control device is configured to adjust a ratio of an output interval of said output power to a halted interval of said output power.

4. The ion source according to claim 1,
   wherein said control device shortens a halted interval of said output power with time, in an initial interval from a start of output of said output power.

5. The ion source according to claim 1,
   wherein said control device lengthens a halted interval of said output power with time, in a final interval until an end of output of said output power.

6. The ion source according to claim 1,
   wherein said control device is configured to adjust a frequency of a halted interval of said output power, and
   wherein said control device is capable of adjusting a ratio of an output interval of said output power to the halted interval of said output power.

7. The ion source according to claim 1,
   wherein said control device is configured to adjust a frequency of a halted interval of said output power,
   wherein said control device shortens the halted interval of said output power with time, in an initial interval from a start of output of said output power, and
   wherein said control device lengthens the halted interval of said output power with time, in a final interval until an end of output of said output power.

8. The ion source according to claim 1,
   wherein said control device is configured to adjust a ratio of an output interval of said output power to a halted interval of said output power,
   wherein said control device shortens the halted interval of said output power with time, in an initial interval from a start of output of said output power, and wherein said control device lengthens the halted interval of said output power with time, in a final interval until an end of output of said output power.

* * * * *